US012642050B2

(12) United States Patent
Kim

(10) Patent No.: US 12,642,050 B2
(45) Date of Patent: May 26, 2026

(54) ELECTROSTATIC CHUCK INCLUDING UPPER PLATE AND SUBSTRATE PROCESSING APPARATUS INCLUDING THE SAME

(71) Applicant: SAMSUNG ELECTRONICS CO., LTD., Suwon-si (KR)

(72) Inventor: Uiyong Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 228 days.

(21) Appl. No.: 18/081,281

(22) Filed: Dec. 14, 2022

(65) Prior Publication Data

US 2023/0187253 A1      Jun. 15, 2023

(30) Foreign Application Priority Data

Dec. 15, 2021    (KR) ......................... 10-2021-0179714

(51) Int. Cl.
*H01L 21/683* (2006.01)
*H01L 21/687* (2006.01)

(52) U.S. Cl.
CPC ...... *H01L 21/6833* (2013.01); *H01L 21/6875* (2013.01); *H01L 21/68785* (2013.01)

(58) Field of Classification Search
CPC ......................... H01L 21/6833; H01L 21/6875
See application file for complete search history.

(56) References Cited

U.S. PATENT DOCUMENTS

| | | | | |
|---|---|---|---|---|
| 5,946,183 | A * | 8/1999 | Yamada ................. | H02N 13/00 |
| | | | | 361/234 |
| 6,320,736 | B1 * | 11/2001 | Shamouilian ....... | C23C 16/4586 |
| | | | | 361/115 |
| 6,377,437 | B1 | 4/2002 | Sexton et al. | |
| 6,556,414 | B2 | 4/2003 | Kosakai | |
| 6,558,508 | B1 | 5/2003 | Kawakami | |
| 7,718,007 | B2 * | 5/2010 | Oohashi ............ | H01L 21/68785 |
| | | | | 118/728 |
| 8,139,340 | B2 | 3/2012 | Reynolds | |
| 8,390,980 | B2 | 3/2013 | Sansoni et al. | |
| 9,530,679 | B2 | 12/2016 | Gaff et al. | |
| 12,020,960 | B2 * | 6/2024 | Smith ............... | H01L 21/68771 |
| 2002/0130276 | A1 | 9/2002 | Sogard | |

(Continued)

FOREIGN PATENT DOCUMENTS

| | | |
|---|---|---|
| JP | 2001-250816 A | 9/2001 |
| JP | 2002-231702 A | 8/2002 |

(Continued)

*Primary Examiner* — Crystal L Hammond
*Assistant Examiner* — Samantha L Faubert
(74) *Attorney, Agent, or Firm* — Sughrue Mion, PLLC

(57) ABSTRACT

An electrostatic chuck according to the disclosure includes a chuck base, and an upper plate. The upper plate includes a base portion, and a first contact pattern, a second contact pattern and an outer dam protruding from the base portion. The outer dam surrounds the first contact pattern structure and the second contact pattern structure. A distance of the second contact pattern structure to the outer dam is less than a distance from the first contact pattern structure to the outer dam. A surface roughness of a top surface of the second contact pattern structure is greater than a surface roughness of a top surface of the first contact pattern structure.

18 Claims, 7 Drawing Sheets

(56)                    References Cited

U.S. PATENT DOCUMENTS

| | | | |
|---|---|---|---|
| 2006/0158822 A1 | 7/2006 | Kondo et al. | |
| 2008/0037194 A1* | 2/2008 | Kamitani | H01L 21/6833 |
| | | | 361/234 |
| 2009/0002913 A1 | 1/2009 | Naim | |
| 2009/0097184 A1 | 4/2009 | Buchberger, Jr. et al. | |
| 2010/0103584 A1 | 4/2010 | Nam | |
| 2011/0092072 A1 | 4/2011 | Singh et al. | |
| 2011/0297082 A1 | 12/2011 | Watanabe et al. | |
| 2013/0224675 A1 | 8/2013 | Park | |
| 2014/0004702 A1 | 1/2014 | Singh | |
| 2014/0340813 A1* | 11/2014 | Anada | H01L 21/6833 |
| | | | 361/234 |
| 2016/0035610 A1 | 2/2016 | Park et al. | |
| 2016/0036355 A1* | 2/2016 | Moriya | H02N 13/00 |
| 2017/0098568 A1 | 4/2017 | Cooke | |
| 2021/0035843 A1* | 2/2021 | Li | H01L 21/6833 |

FOREIGN PATENT DOCUMENTS

| | | | |
|---|---|---|---|
| JP | 2002-305238 A | 10/2002 | |
| JP | 2004-22585 A | 1/2004 |
| JP | 2005-32858 A | 2/2005 |
| JP | 2005-79415 A | 3/2005 |
| JP | 2006-245621 A | 9/2006 |
| JP | 2008-166508 A | 7/2008 |
| JP | 2011-501418 A | 1/2011 |
| JP | 2011-049196 A | 3/2011 |
| JP | 2011-119708 A | 6/2011 |
| JP | 2011-258614 A | 12/2011 |
| KR | 10-2001-0080296 A | 8/2001 |
| KR | 10-2007-0032966 A | 3/2007 |
| KR | 10-2007-0033221 A | 3/2007 |
| KR | 10-2007-0050111 A | 5/2007 |
| KR | 10-2007-0118783 A | 12/2007 |
| KR | 10-2010-0015515 A | 2/2010 |
| KR | 10-2010-0046909 A | 5/2010 |
| KR | 10-2012-0103596 A | 9/2012 |
| KR | 10-2013-0098707 A | 9/2013 |
| KR | 10-2014-0118670 A | 10/2014 |
| KR | 10-2016-0015510 A | 2/2016 |
| KR | 10-2022-0072918 A | 6/2022 |
| WO | 2008112673 A2 | 9/2008 |

* cited by examiner

De-chuck process

ELECTROSTATIC CHUCK INCLUDING UPPER PLATE AND SUBSTRATE PROCESSING APPARATUS INCLUDING THE SAME

CROSS-REFERENCE TO RELATED APPLICATION

This application claims priority from Korean Patent Application No. 10-2021-0179714, filed on Dec. 15, 2021, in the Korean Intellectual Property Office, the disclosure of which is incorporated herein by reference in its entirety.

BACKGROUND

1. Field

Example embodiments of the disclosure relate to an electrostatic chuck and a substrate processing apparatus including the same, and more particularly, to an electrostatic chuck including an upper plate, and a substrate processing apparatus including the same.

2. Description of Related Art

Generally, a semiconductor device may be manufactured through a plurality of unit processes. The unit processes may include a deposition process, a photo process, and an etching process. The deposition process and the etching process may be performed using plasma reaction. A substrate processing apparatus using plasma reaction may include an electrostatic chuck configured to chuck a substrate. The electrostatic chuck may chuck the substrate by electrostatic force.

SUMMARY

One or more example embodiments of the disclosure provide an electrostatic chuck capable of efficiently de-chucking a substrate.

According to an aspect of an example embodiment, an electrostatic chuck includes: a chuck base; and an upper plate, wherein the upper plate includes a base portion, a first contact pattern structure, a second contact pattern structure, and an outer dam, wherein each of the first contact pattern structure, the second contact pattern structure, and the outer dam protrudes from the base portion, wherein the outer dam surrounds the first contact pattern structure and the second contact pattern structure, wherein a distance of the second contact pattern structure to the outer dam is less than a distance from the first contact pattern structure to the outer dam, and wherein a surface roughness of a top surface of the second contact pattern structure is greater than a surface roughness of a top surface of the first contact pattern structure.

According to an aspect of an example embodiment, substrate processing apparatus including: a chamber; and an electrostatic chuck provided in the chamber, wherein the electrostatic chuck includes an upper plate and a chuck base supporting the upper plate, wherein the upper plate includes a base portion, a first contact pattern structure, a second contact pattern structure, and an outer dam, wherein each of the first contact pattern structure, the second contact pattern structure, and the outer dam protrudes from the base portion, wherein a distance from the second contact pattern structure to the outer dam is less than a distance from the first contact pattern structure to the outer dam, and wherein a diameter of a top surface of the second contact pattern structure is smaller than a diameter of a top surface of the first contact pattern structure.

According to an aspect of an example embodiment, an electrostatic chuck includes: an upper plate configured to chuck a substrate thereon; and a chuck base supporting the upper plate, wherein the upper plate includes: a base portion including an inner region and an outer region surrounding the inner region, first contact pattern structures protruding from the inner region, second contact pattern structures protruding from the outer region, and an outer dam surrounding the first contact pattern structures and the second contact pattern structures, wherein each of the first contact pattern structures and each of the second contact pattern structures has a form of a circular pillar, and wherein a distance between two adjacent ones of the first contact pattern structures is smaller than a distance between two adjacent ones of the second contact pattern structures.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
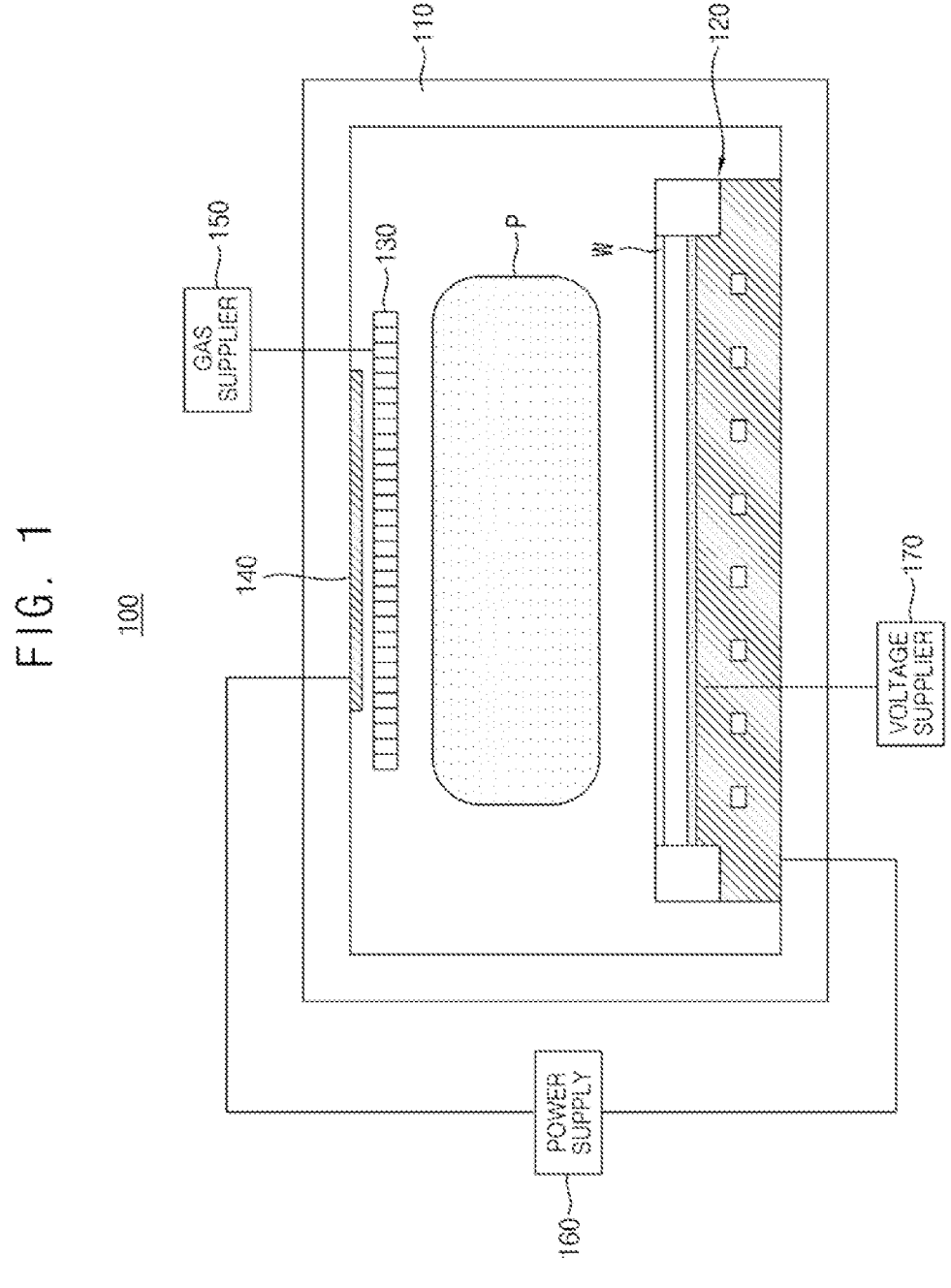
FIG. 1 is a view explaining a substrate processing apparatus according to an example embodiment.

FIG. 1 is a view explaining a substrate processing apparatus according to an example embodiment.

Referring to FIG. 1, a substrate processing apparatus 100 according to some example embodiments may be an apparatus for performing a process of processing a substrate W for manufacture of a semiconductor device. In some embodiments, the substrate processing apparatus 100 may be a plasma apparatus. For example, the substrate processing apparatus 100 may be a capacitively coupled plasma apparatus, an inductively coupled plasma apparatus, or a microwave plasma apparatus. The substrate processing apparatus 100 may be an etching apparatus or a deposition apparatus. In some embodiments, the substrate W may be a semiconductor substrate including silicon or germanium. In some embodiments, the substrate W may be a silicon-on-insulator (SOI) substrate.

The substrate processing apparatus 100 may include a chamber 110, an electrostatic chuck 120, a shower head 130, an upper electrode 140, a gas supplier 150, a power supply 160, and a constant voltage supplier 170.

The chamber 110 may provide an interior space independent from an outside of the chamber 110. In accordance with driving of the chamber 110, the interior space of the chamber 110 may be opened or closed. The electrostatic chuck 120, the shower head 130, and the upper electrode 140 may be provided in the chamber 110. The substrate W may be chucked on the electrostatic chuck 120. The upper electrode 140 may be disposed adjacent to the shower head 130. In some embodiments, the upper electrode 140 and the shower head 130 may be disposed at an upper portion of the chamber 110, and the electrostatic chuck 120 may be disposed at a lower portion of the chamber 110.

The gas supplier 150 may be connected to the shower head 130. The gas supplier 150 may supply a process gas to the shower head 130. The process gas supplied to the shower head 130 may be injected into the chamber 110 through the shower head 130. The process gas may be a gas used in a substrate processing process performed in the substrate processing apparatus 100.

The power supply 160 may supply power to the upper electrode 140 and the electrostatic chuck 120. For example, the power supply 160 may supply high-frequency power to the upper electrode 140 and the electrostatic chuck 120. In some embodiments, the power supply 160 may include a part supplying power to the upper electrode 140 and a part supplying power to the electrostatic chuck 120. In accordance with supply of power from the power supply 160, a plasma P may be produced from the process gas injected into the chamber 110 through the shower head 130, and the plasma P may be concentrated toward the substrate W. The plasma P may be produced between the upper electrode 140 and the electrostatic chuck 120. The substrate processing apparatus 100 may process the substrate W using the produced plasma P.

In some embodiments, the substrate processing apparatus 100 may not include the upper electrode 140. In this case, the power supply 160 may supply power only to the electrostatic chuck 120.

The constant voltage supplier 170 may supply a constant voltage to the electrostatic chuck 120. The electrostatic chuck 120 may chuck the substrate W using the constant voltage supplied thereto. For example, the substrate W may be chucked on the electrostatic chuck 120 by Coulomb force or Johnsen-Rahbek force.

Figure 2:
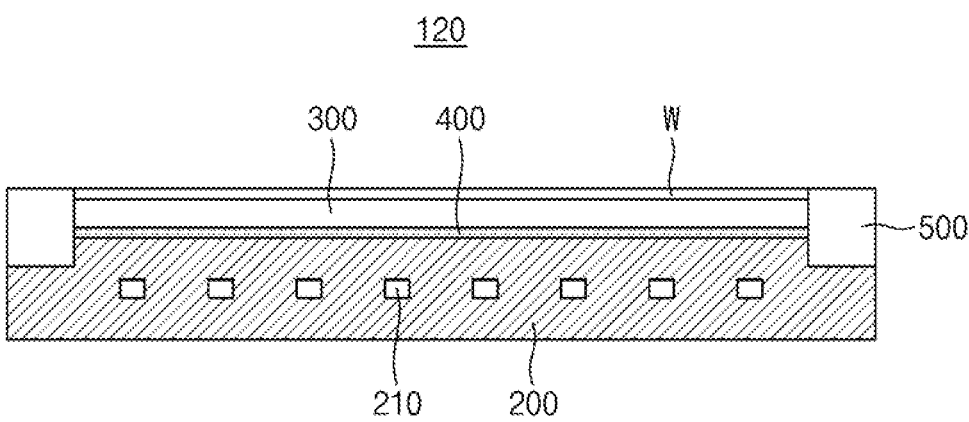
FIG. 2 is a view explaining the electrostatic chuck of the substrate processing apparatus according to FIG. 1.

FIG. 2 is a view explaining the electrostatic chuck 120 of the substrate processing apparatus 100 according to FIG. 1.

Referring to FIG. 2, the electrostatic chuck 120 may include a chuck base 200, an upper plate 300, an adhesive layer 400, and an edge ring 500. The chuck base 200 may support the upper plate 300, the adhesive layer 400 and the edge ring 500. The chuck base 200 may include a conductive material. For example, the chuck base 200 may include Al.

The chuck base 200 may include cooling water holes 210. Cooling water may be provided to the cooling water holes 210, thereby cooling the electrostatic chuck 120.

The upper plate 300 may be disposed over the chuck base 200. The upper plate 300 may include an insulating material. For example, the upper plate 300 may include AlN. A substrate W may be chucked on the upper plate 300 by a constant voltage applied to the electrostatic chuck 120.

The adhesive layer 400 may be interposed between the chuck base 200 and the upper plate 300. The adhesive layer 400 may bond the upper plate 300 to the chuck base 200. The adhesive layer 400 may include an adhesive material. For example, the adhesive layer 400 may be a silicon adhesive layer.

The edge ring 500 may be disposed on the chuck base 200. The edge ring 500 may have a ring shape and surround the adhesive layer 400 and the upper plate 300. When the substrate W is chucked on the upper plate 300, the edge ring 500 may surround the substrate W. The edge ring 500 may include, for example, Si or SiC.

Figure 3A:
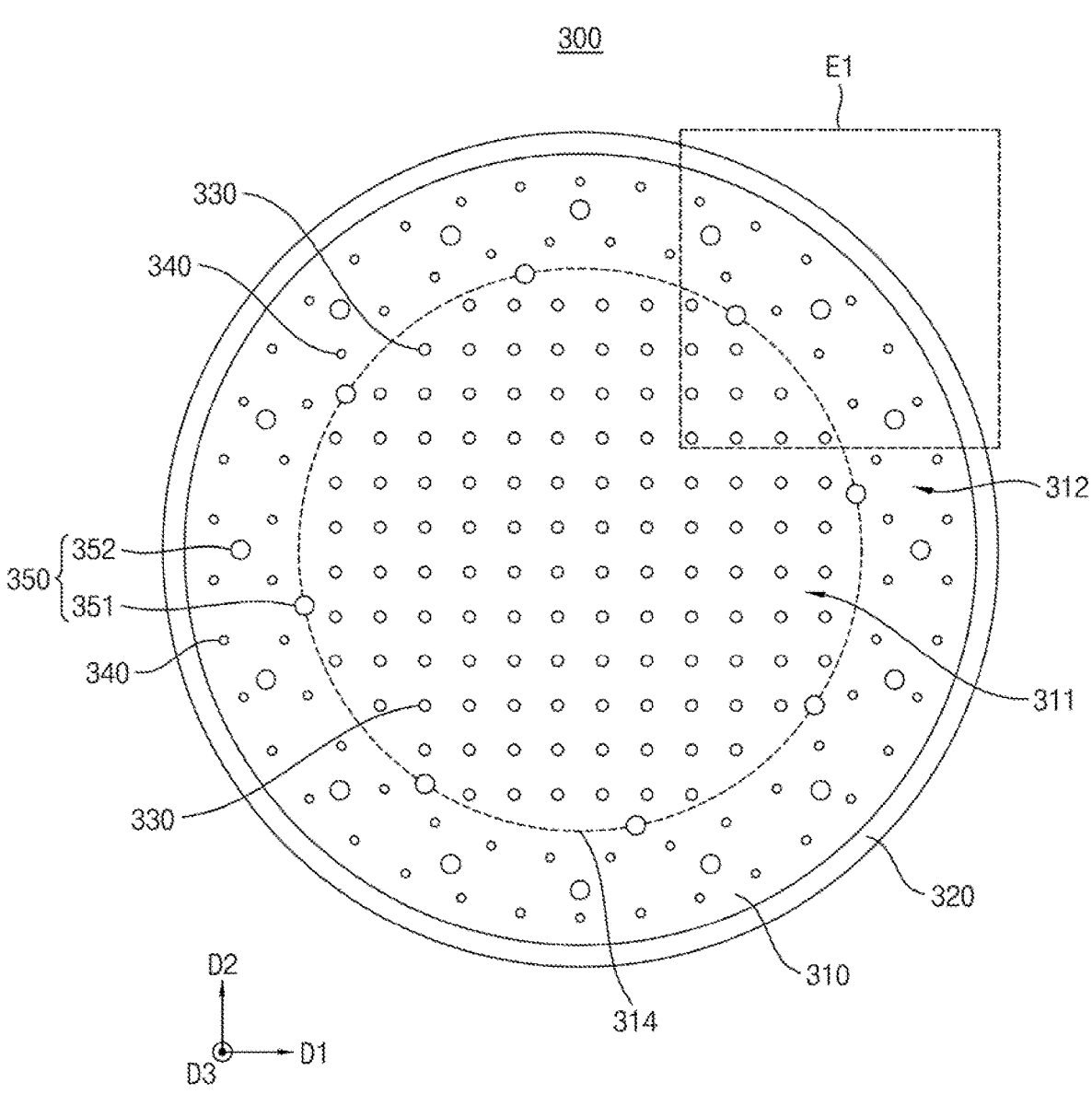
FIG. 3A is a plan view of the upper plate of the electrostatic chuck according to FIG. 2.
Figure 3B:
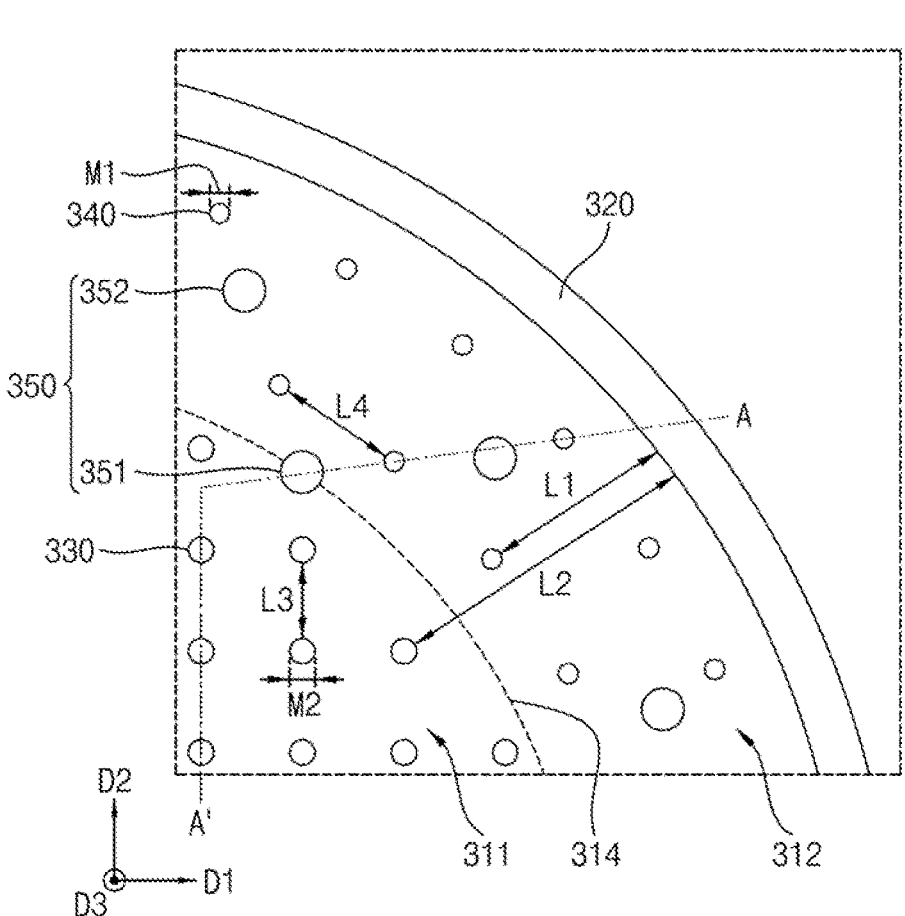
FIG. 3B is an enlarged view of a region E1 of FIG. 3A.
Figure 3C:
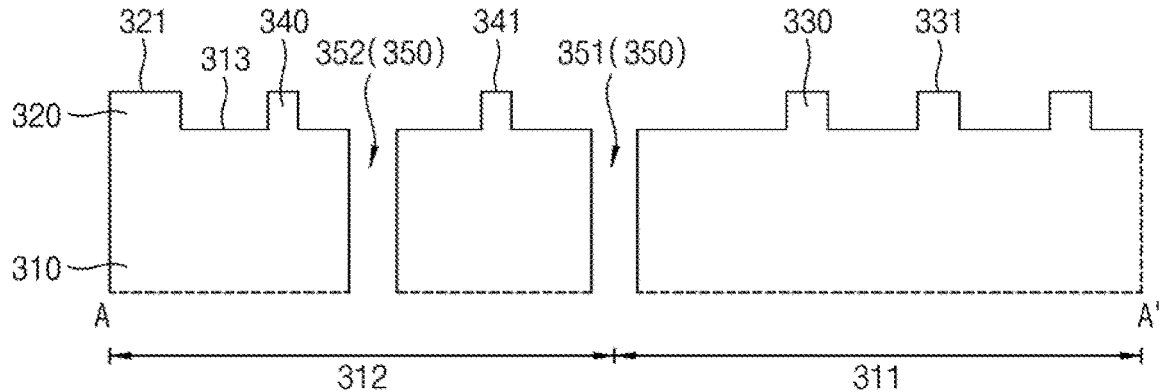
FIG. 3C is a cross-sectional view taken along line A-A' in FIG. 3B.

FIG. 3A is a plan view of the upper plate 300 of the electrostatic chuck 120 according to FIG. 2. FIG. 3B is an enlarged view of a region E1 of FIG. 3A. FIG. 3C is a cross-sectional view taken along line A-A' in FIG. 3B.

Referring to FIGS. 3A, 3B, and 3C, the upper plate 300 may include a base portion 310, an outer dam 320, first contact patterns (first contact pattern structures) 330 and second contact patterns (second contact pattern structures) 340 protruding from the base portion 310, and gas holes 350 extending through the base portion 310. The base portion 310, the outer dam 320, and the first and second contact patterns 330 and 340 may include an insulating material. For example, the base portion 310, the outer dam 320, and the first and second contact patterns 330 and 340 may include AlN.

The base portion 310 may have the form of a circular plate extending along a plane extending in a first direction D1 and a second direction D2. The first direction D1 and the second direction D2 may intersect each other. For example, the first direction D1 and the second direction D2 may be horizontal directions perpendicularly intersecting each other as shown, e.g., in FIGS. 3A and 3B.

The base portion 310 may include an inner region 311, and an outer region 312 surrounding the inner region 311. The inner region 311 and the outer region 312 of the base portion 310 may be regions divided from each other in plan view as shown, e.g., in FIG. 3A.

The outer dam 320, the first contact patterns 330, and the second contact patterns 340 may protrude from the base portion 310 in a third direction D3. The third direction D3 may intersect the first direction D1 and the second direction D2. For example, the third direction D3 may be a vertical direction intersecting the first direction D1 and the second direction D2. The outer dam 320, the first contact patterns 330, and the second contact patterns 340 may protrude from a top surface 313 of the base portion 310.

The outer dam 320 may protrude from the outer region 312 of the base portion 310. The outer dam 320 may have the form of a ring surrounding the inner region 311 of the base portion 310. The outer dam 320 may surround the first contact patterns 330, the second contact patterns 340, and the gas holes 350. In some embodiments, the width of the outer dam 320 may be 1.1 to 1.3 mm. For example, the width of the outer dam 320 may be 1.25 mm.

The first contact patterns 330 may protrude from the inner region 311 of the base portion 310. The first contact patterns 330 may have the form of a circular pillar. The second contact patterns 340 may protrude from the outer region 312 of the base portion 310. The second contact patterns 340 may have the form of a circular pillar.

When the substrate W is chucked on the electrostatic chuck 120, a top surface 321 of the outer dam 320, top surfaces 331 of the first contact patterns 330, and top surfaces 341 of the second contact patterns 340 may contact a bottom surface of the substrate W. A contact ratio (C/R) of the substrate W for the outer dam 320 may be higher than a C/R of the substrate W for the first contact patterns 330 and the second contact patterns 340. In other words, a ratio of a surface area of the outer dam 320 to a surface area of the base portion 310 may be higher than a ratio of a surface area of the first contact patterns 330 and the second contact patterns 340 to the surface area of the base portion 310. In some embodiments, the C/R of the substrate W for the outer dam 320 may be 1.28 to 1.48%, and the C/R of the substrate W for the first contact patterns 330 and the second contact patterns 340 may be 0.77 to 0.97%. For example, the C/R of the substrate W for the outer dam 320 may be 1.38%, and the C/R of the substrate W for the first contact patterns 330 and the second contact patterns 340 may be 0.87%. In this case, an area ratio of the substrate W contacting the outer dam 320 at the bottom surface of the substrate W may be 1.38%, and an area ratio of the substrate W contacting the first contact patterns 330 and the second contact patterns 340 at the bottom surface of the substrate W may be 0.87%. As the C/R of the substrate W increases, a chucking force exerted on the substrate W may increase. The levels of the top surface 321 of the outer dam 320, the top surfaces 331 of the first contact patterns 330 and the top surfaces 341 of the second contact patterns 340 may be equal (e.g., at a same level).

The second contact patterns 340 may be disposed adjacent to the outer dam 320. The second contact patterns 340 may be disposed nearer to the outer dam 320 than the first contact patterns 330. A distance L1 between the second contact pattern 340 and the outer dam 320 may be smaller than a distance L2 between the first contact pattern 330 and the outer dam 320.

The surface roughness of the top surface 331 of the first contact pattern 330 may be smaller than the surface roughness of the top surface 341 of the second contact pattern 340. In some embodiments, surface roughness Ra of the top surface 331 of the first contact pattern 330 may be 0.08 to 0.12 μm, and surface roughness Ra of the top surface 341 of the second contact pattern 340 may be 0.7 to 0.9 μm. For example, the surface roughness Ra of the top surface 331 of the first contact pattern 330 may be 0.1 μm, and the surface roughness Ra of the top surface 341 of the second contact pattern 340 may be 0.8 μm. The surface roughness of the top surface 321 of the outer dam 320 may be different from the surface roughness of the top surface 331 of the first contact pattern 330 and the surface roughness of the top surface 341 of the second contact pattern 340.

A diameter M1 of each of the top surfaces 341 of the second contact patterns 340 may be smaller than a diameter M2 of each of the top surfaces 331 of the first contact patterns 330. In some embodiments, the diameter M1 of each of the top surfaces 341 of the second contact patterns 340 may be 0.4 to 0.6 mm, and the diameter M2 of each of the top surfaces 331 of the first contact patterns 330 may be 0.9 to 1.1 mm. For example, the diameter M1 of each of the top surfaces 341 of the second contact patterns 340 may be 0.5 mm, and the diameter M2 of each of the top surfaces 331 of the first contact patterns 330 may be 1 mm.

The spacing among the first contact patterns 330 may be smaller than the spacing among the second contact patterns 340. A distance L3 between two adjacent ones of the first contact patterns 330 may be smaller than a distance L4 between two adjacent ones of the second contact patterns 340.

The number of the first contact patterns 330 may be greater than the number of the second contact patterns 340. In some embodiments, the number of the first contact patterns 330 may be 714 to 734, and the number of the second contact patterns 340 may be 47 to 67. For example, the number of the first contact patterns may be 724, and the number of the second contact patterns 340 may be 57.

The gas holes 350 may be disposed in the outer region 312 or at a boundary 314 between the outer region 312 and the inner region 311. The gas hole 350 may extend through the base portion 310 in the third direction D3. The gas hole 350 may be a hole through which a refrigerant provided to the bottom surface of the substrate W passes. The refrigerant under the upper plate 300 may be provided to a region over the upper plate 300 through the gas hole 350. For example, the refrigerant may be He gas.

The gas holes 350 may include inner gas holes 351 and outer gas holes 352. The inner gas holes 351 may be disposed at the boundary 314 between the outer region 312 and the inner region 311. The outer gas holes 352 may be disposed in the outer region 312. The inner gas holes 351 may be disposed farther from the outer dam 320 than the second contact patterns 340. The inner gas holes 351 may be disposed nearer to the outer dam 320 than the first contact patterns 330. The outer gas holes 352 may be disposed among the second contact patterns 340. The outer gas holes 352 may be disposed nearer to the outer dam 320 than a part of (e.g., at least one of) the second contact patterns 340, and may be disposed farther from the outer dam 320 than the remaining part of (e.g., at least one other of) the second contact patterns 340. A part of the second contact patterns 340 may be disposed between the outer gas holes 352 and the inner gas holes 351. The outer gas holes 352 may be disposed nearer to the outer dam 320 than the first contact patterns 330.

In some embodiments, the electrostatic chuck 120 may further include a lift pin configured to lift the substrate W. In this case, the upper plate 300 may further include a lift pin hole through which the lift pin passes.

In the electrostatic chuck according to the exemplary embodiments of the disclosure, the second contact patterns 340 disposed relatively near to the outer dam 320 may have relatively great surface roughness, a relatively small diameter, and a relatively great spacing. Accordingly, the C/R of the substrate W for the second contact patterns 340 may be relatively low.

Although the C/R for the outer dam 320 is relatively high, this may be compensated for by disposing the second contact patterns 340 relatively near the outer dam 320. Accordingly, a phenomenon in which excessive chucking force is generated around the outer dam 320 may be prevented and, as such, the time taken in a de-chucking process may be reduced, and a chucking force reduction speed may be uniform. As a result, a phenomenon in which the substrate W is damaged in the de-chucking process may be prevented.

Figure 4A:
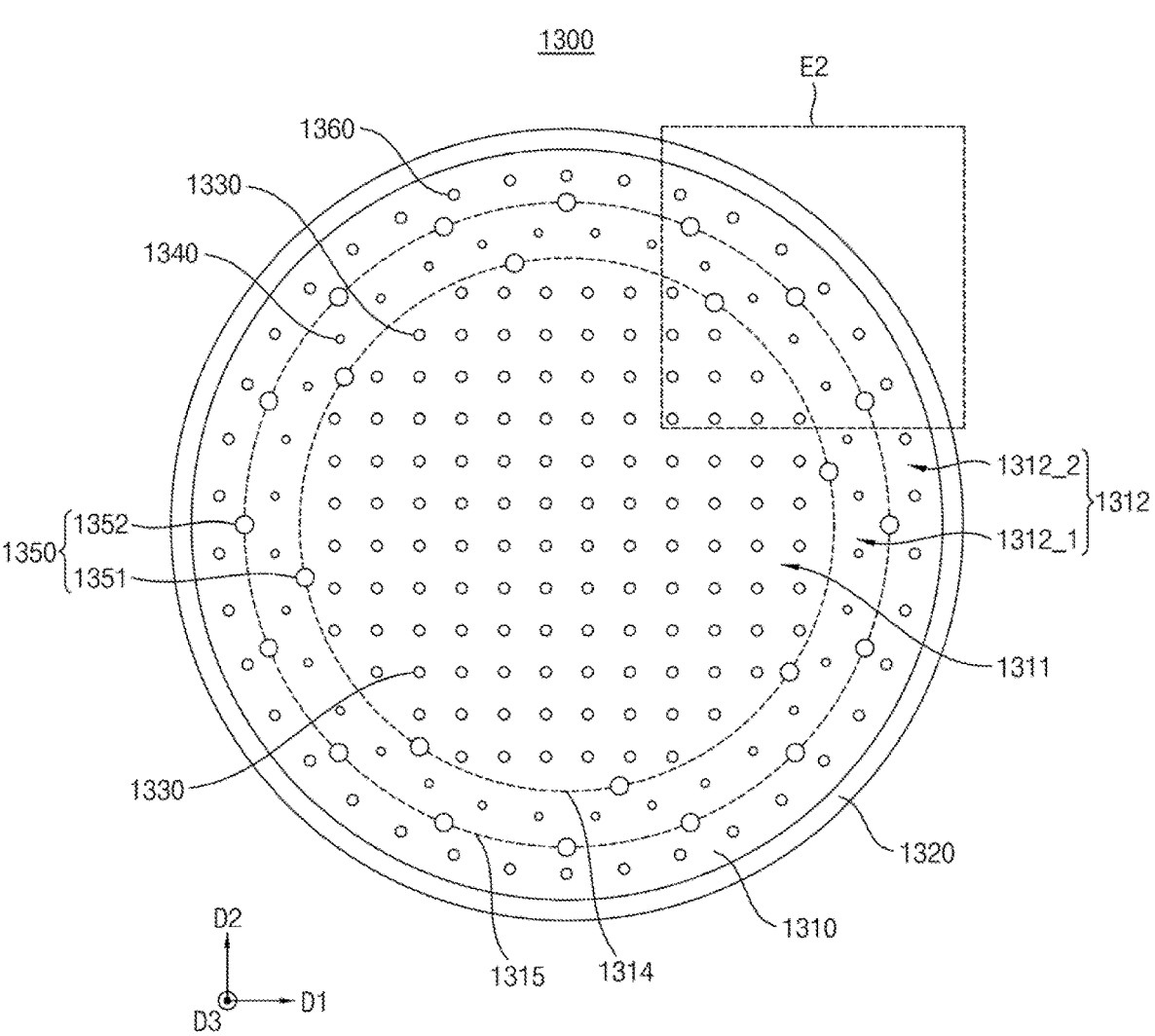
FIG. 4A is a plan view of an upper plate of an electrostatic chuck according to an example embodiment.
Figure 4B:
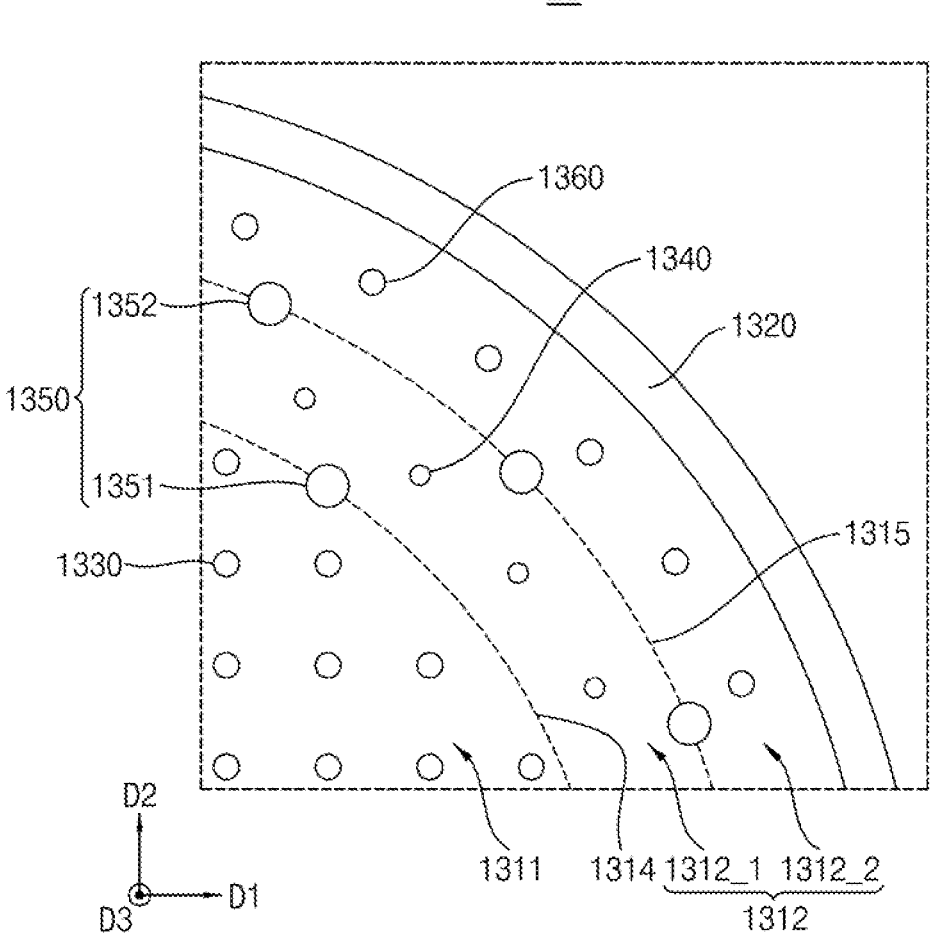
FIG. 4B is an enlarged view of a region E2 of FIG. 4A.

FIG. 4A is a plan view of an upper plate of an electrostatic chuck according to some exemplary embodiments of the disclosure. FIG. 4B is an enlarged view of a region E2 of FIG. 4A.

Referring to FIGS. 4A and 4B, an upper plate 1300 may include a base portion 1310, an outer dam 1320, first contact patterns (first contact pattern structures) 1330, second contact patterns (second contact pattern structures) 1340 and third contact patterns (third contact pattern structures) 1360 protruding from the base portion 1310, and gas holes 1350 extending through the base portion 1310.

The base portion 1310 may include an inner region 1311, and an outer region 1312 surrounding the inner region 1311. The outer region 1312 may include a first portion 1312_1 connected to the inner region 1311, and a second portion 1312_2 surrounding the first portion 1312_1.

The first contact patterns 1330 may protrude from the inner region 1311. The second contact patterns 1340 may protrude from the first portion 1312_1 of the outer region 1312. The third contact patterns 1360 may protrude from the second portion 1312_2 of the outer region 1312. The third contact patterns 1360 may be disposed nearer to the outer dam 1320 than the second contact patterns 1340. The first to third contact patterns 1330, 1340, and 1360 may have the form of a circular pillar.

The second contact patterns 1340 may have a smaller diameter than the first and third contact patterns 1330 and 1360. The surface roughness of top surfaces of the second contact patterns 1340 may be greater than the surface roughness of top surfaces of the first and third contact patterns 1330 and 1360. The spacing among the second contact patterns 1340 may be greater than the spacing among the first contact patterns 1330 and the spacing among the third contact patterns 1360. The distance between two adjacent ones of the third contact patterns 1360 may be smaller than the distance between two adjacent ones of the second contact patterns 1340.

In some embodiments, the diameter of the first contact patterns 1330 and the diameter of the third contact patterns 1360 may be equal, the surface roughness of top surfaces of the first contact patterns 1330 and the surface roughness of top surfaces of the third contact patterns 1360 may be equal, and the spacing among the first contact patterns 1330 and the spacing among the third contact patterns 1360 may be equal.

The gas holes 1350 may include inner gas holes 1351 and outer gas holes 1352. The inner gas holes 1351 may be disposed at a boundary 1314 between the inner region 1311 and the first portion 1312_1 of the outer region 1312. The outer gas holes 1352 may be disposed at a boundary 1315 between the first portion 1312_1 and the second portion 1312_2 of the outer region 1312. The second contact patterns 1340 may be disposed between the inner gas holes 1351 and the outer gas holes 1352. The third contact patterns 1360 may be disposed nearer to the outer dam 1320 than the outer gas holes 1352.

Figure 5:
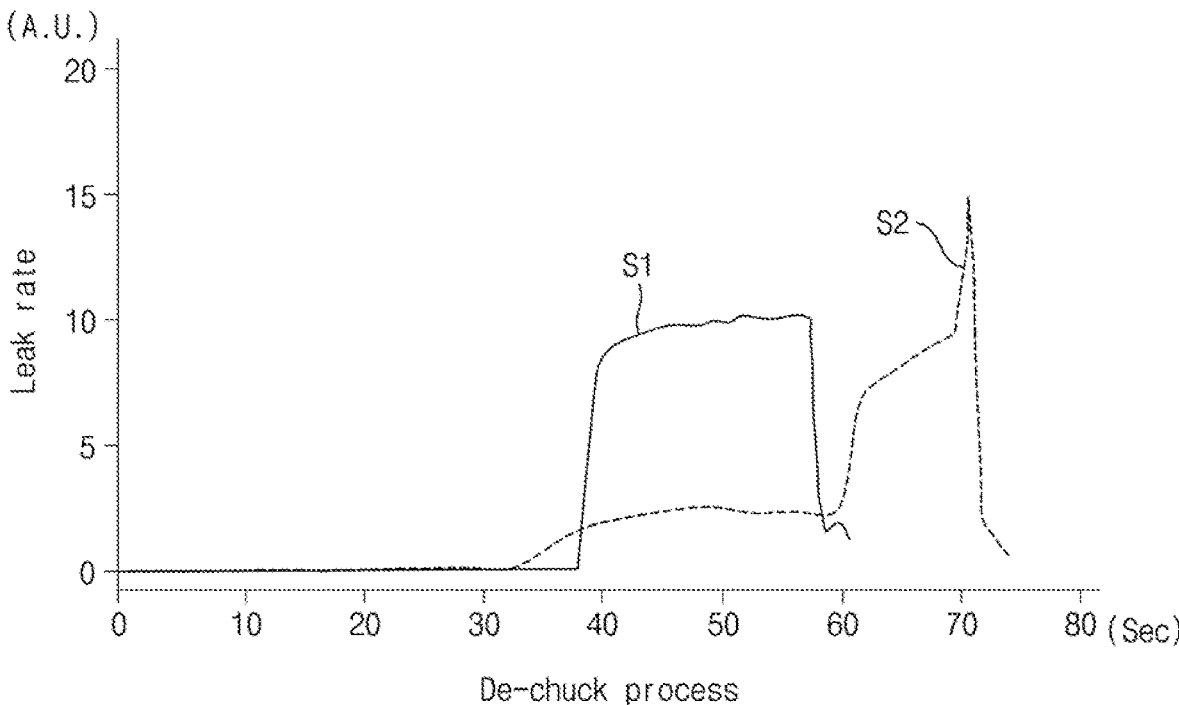
FIG. 5 is a graph explaining de-chucking characteristics of an electrostatic chuck according to an example embodiment.

FIG. 5 is a graph explaining de-chucking characteristics of an electrostatic chuck according to an example embodiment.

Referring to FIG. 5, de-chucking characteristics of an electrostatic chuck S1 according to an exemplary embodiment of the disclosure and an electrostatic chuck S2 according to a comparative example were measured. The electrostatic chuck S1 according to the exemplary embodiment of the disclosure includes first contact patterns having surface roughness of 0.1 μm and a diameter of 1 mm, and second contact patterns having surface roughness of 0.8 μm and a diameter of 0.5 mm, and the second contact patterns are disposed near an outer dam. The electrostatic chuck S2 according to the comparative example includes contact patterns having surface roughness of 0.1 μm and a diameter of 1 mm.

After measurement of a leak rate of He gas in a de-chucking process, it was found that, in the electrostatic chuck S1 according to the exemplary embodiment of the disclosure, the time taken in the de-chucking process is relatively short, and the leak rate of the He gas is relatively uniformly increased.

The electrostatic chuck according to the exemplary embodiments of the disclosure may include contact patterns different in surface roughness, size and spacing and, as such, de-chucking characteristics of the electrostatic chuck may be enhanced.

While example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

8

What is claimed is:

1. An electrostatic chuck comprising:
a chuck base; and
an upper plate,
wherein the upper plate comprises a base portion, a first contact pattern structure, a second contact pattern structure, and an outer dam, wherein each of the first contact pattern structure, the second contact pattern structure, and the outer dam protrudes from the base portion,
wherein the outer dam surrounds the first contact pattern structure and the second contact pattern structure,
wherein a distance from the second contact pattern structure to the outer dam is less than a distance from the first contact pattern structure to the outer dam, and
wherein a surface roughness of a surface of each protrusion of the second contact pattern structure is greater than a surface roughness of a surface of each protrusion of the first contact pattern structure.

2. The electrostatic chuck according to claim 1, wherein a diameter of the surface of the second contact pattern structure is smaller than a diameter of the surface of the first contact pattern structure.

3. The electrostatic chuck according to claim 2, wherein the diameter of the surface of the second contact pattern structure is 0.4 to 0.6 mm; and
the diameter of the surface of the first contact pattern structure is 0.9 to 1.1 mm.

4. The electrostatic chuck according to claim 1, wherein the surface roughness of the surface of the second contact pattern structure is 0.7 to 0.9 μm; and
the surface roughness of the surface of the first contact pattern structure is 0.08 to 0.12 μm.

5. The electrostatic chuck according to claim 1, wherein the upper plate further comprises a third contact pattern structure protruding from the base portion;
a distance from the third contact pattern structure to the outer dam is less than the distance from the second contact pattern structure to the outer dam; and
a surface roughness of a surface of the third contact pattern structure is smaller than the surface roughness of the surface of the second contact pattern structure.

6. The electrostatic chuck according to claim 1, wherein the upper plate comprises an inner gas hole extending through the base portion and an outer gas hole extending through the base portion;
a distance from the outer gas hole to the outer dam is less than the distance from the second contact pattern structure to the outer; and
a distance from the inner gas hole to the outer dam is greater than the distance from the second contact pattern structure to the outer dam.

7. The electrostatic chuck according to claim 6, wherein the distance from the inner gas hole the outer dam is less than the distance from the first contact pattern structure to the outer dam.

8. The electrostatic chuck according to claim 1, wherein the second contact pattern structure comprises (i) a first set of protrusions forming a first concentric circle having a first diameter and (ii) a second set of protrusions forming a second concentric circle having a second diameter less than the first diameter, and
wherein a plurality of gas holes are located between the first set of protrusions and the second set of protrusions.

9. A substrate processing apparatus comprising:
a chamber; and
an electrostatic chuck provided in the chamber,
wherein the electrostatic chuck comprises an upper plate and a chuck base supporting the upper plate, wherein the upper plate comprises a base portion, a first contact pattern structure, a second contact pattern structure, and an outer dam, wherein each of the first contact pattern structure, the second contact pattern structure, and the outer dam protrudes from a top surface of the base portion, wherein a distance from the second contact pattern structure to the outer dam is less than a distance from the first contact pattern structure to the outer dam, wherein a diameter of a surface of the second contact pattern structure is smaller than a diameter of a surface of the first contact pattern structure, wherein the diameter of the surface of the second contact pattern structure is 0.4 to 0.6 mm, and the diameter of the surface of the first contact pattern structure is 0.9 to 1.1 mm, wherein the first contact pattern structure comprises a plurality of first contact pattern structures, wherein the second contact pattern structure comprises a plurality of second contact pattern structures, wherein a number of the plurality of first contact pattern structures is between 714 to 734 and a number of the plurality of second contact pattern structures is between 47 to 67, and wherein a contact ratio of the outer dam with a substrate is greater than a contact ratio of the plurality of first contact pattern structures and the plurality of second contact pattern structures with the substrate.

10. The substrate processing apparatus according to claim 9, wherein the second contact pattern structure comprises two second contact pattern structures adjacent to each other; the first contact pattern structure comprises two first contact pattern structures adjacent to each other; and a distance between the two second contact pattern structures is greater than a distance between the two first contact pattern structures.

11. The substrate processing apparatus according to claim 9, wherein the upper plate comprises an inner gas hole and an outer gas hole extending through the base portion; and a distance from each of the inner gas hole and the outer gas hole to the outer dam is less than the distance from the first contact pattern structure to the outer dam.

12. The substrate processing apparatus according to claim 11, wherein the second contact pattern structure is located between the inner gas hole and the outer gas hole.

13. The substrate processing apparatus according to claim 11, wherein a distance from at least one second contact pattern structure from among the plurality of second contact pattern structures to the outer dam is less than the distance from the outer gas hole to the outer dam; and wherein a distance from at least one other second contact pattern structure from among the plurality of second contact pattern structures to the outer dam is greater than the distance from the outer gas hole to the outer dam.

14. An electrostatic chuck comprising:

an upper plate configured to chuck a substrate thereon; and a chuck base supporting the upper plate, wherein the upper plate comprises:

a base portion comprising an inner region and an outer region surrounding the inner region, first contact pattern structures protruding from the inner region, second contact pattern structures protruding from the outer region, third contact pattern structures, an outer dam surrounding the first contact pattern structures and the second contact pattern structures, a plurality of inner gas holes, and a plurality of outer gas holes, wherein each of the first contact pattern structures and each of the second contact pattern structures has a form of a circular pillar, wherein a first distance between two adjacent ones of the first contact pattern structures is smaller than a second distance between two adjacent ones of the second contact pattern structures, wherein each second contact pattern structure is spaced apart from an adjacent second contact pattern structure by the second distance, wherein at least a portion of the first contact pattern structures is at a central area of the upper plate, wherein the central area of the upper plate includes a center of the upper plate, wherein each inner gas hole from the plurality of inner gas holes is between the first contact pattern structures and the second contact pattern structures, and wherein each outer gas hole from the plurality of outer gas holes is between the second contact pattern structures and the third contact pattern structures.

15. The electrostatic chuck according to claim 14, wherein the outer region comprises a first portion connected to the inner region, and a second portion surrounding the first portion; and the second contact pattern structures protrude from the first portion.

16. The electrostatic chuck according to claim 15, wherein the third contact pattern structures protrude from the second portion; and a distance between two adjacent ones of the third contact pattern structures is smaller than the distance between the two adjacent ones of the second contact pattern structures.

17. The electrostatic chuck according to claim 14, wherein a ratio of a surface area of the outer dam to a surface area of the base portion is greater than a ratio of a surface area of the first contact pattern structures and the second contact pattern structures to the surface area of the base portion.

18. The electrostatic chuck according to claim 17, wherein the ratio of the surface area of the outer dam to the surface area of the base portion is 1.28 to 1.48%; and the ratio of the surface area of the first contact pattern structures and the second contact pattern structures to the surface area of the base portion is 0.77 to 0.97%.

* * * * *